United States Patent [19]

Kakubo et al.

[11] Patent Number: 5,365,468
[45] Date of Patent: Nov. 15, 1994

[54] SAMPLING FREQUENCY CONVERTER

[75] Inventors: Yuji Kakubo, Tachikawa; Shigeki Kimura, Hamamatsu; Hiromi Sotome, Hamamatsu; Koji Niimi, Hamamatsu, all of Japan

[73] Assignee: Yamaha Corporation, Hamamatsu, Japan

[21] Appl. No.: 121,212

[22] Filed: Sep. 14, 1993

Related U.S. Application Data

[63] Continuation of Ser. No. 18,955, Feb. 17, 1993, abandoned.

[30] Foreign Application Priority Data

Feb. 17, 1992 [JP] Japan ................................. 4-061193
Mar. 12, 1992 [JP] Japan ................................. 4-088113

[51] Int. Cl.⁵ .............................................. G06F 15/31
[52] U.S. Cl. .............................................. 364/724.1
[58] Field of Search ........................... 364/724.1, 572; 375/106

[56] References Cited

U.S. PATENT DOCUMENTS

| 4,689,759 | 8/1987 | Anouar et al. | 364/572 |
| 4,748,578 | 5/1988 | Lagadec et al. | 364/724.1 |
| 4,953,117 | 8/1990 | Lagadec | 364/724.1 |
| 5,212,659 | 5/1993 | Scott et al. | 364/724.1 |

FOREIGN PATENT DOCUMENTS

| 61-204700 | 9/1986 | Japan . |
| 62-101112 | 5/1987 | Japan . |
| 63-296511 | 12/1988 | Japan . |
| 1-175311 | 7/1989 | Japan . |
| 2-21712 | 1/1990 | Japan . |
| 2-21714 | 1/1990 | Japan . |

Primary Examiner—Tan V. Mai
Attorney, Agent, or Firm—Spensley Horn Jubas & Lubitz

[57] ABSTRACT

A sampling frequency converter includes an oversampling circuit for oversampling an input sample train, a Random Access Memory (RAM), a write control circuit for writing oversampled data in the RAM with a clock synchronized with the oversampled data, a sampling frequency ratio measuring circuit for measuring a frequency ratio of a sampling frequency of the input sample train and a sampling frequency of an output sample train, a read control circuit for reading from the RAM the oversampled data used for obtaining interpolation data at two points before and after an output sample value which realizes the measured sampling frequency ratio by a polynomial interpolation, a polynomial interpolation circuit for obtaining the interpolation data at the two points by the polynomial interpolation on the basis of the oversampled data read from the RAM by the read control circuit, and a linear interpolation circuit for linear-interpolating between the polynomial interpolation data at the two points and thereby obtaining the output sample value realizing the sampling frequency ratio. The sampling frequency ratio measuring circuit may include a counter and a count outputting circuit which measures a count for plural word periods of the output sample and outputs this count as the measured value of the sampling frequency ratio.

5 Claims, 11 Drawing Sheets

SAMPLING FREQUENCY CONVERTER

This is a continuation of application Ser. No. 08/018,995, filed Feb. 17, 1993, now abandoned.

BACKGROUND OF THE INVENTION

This invention relates to a sampling frequency converter for converting an input sample train to an output sample train which is not synchronous with the input sample train and, more particularly, to a sampling frequency converter designed to have an improved conversion accuracy with a simple structure.

Various sampling frequencies such as 32 kHz, 44.1 kHz and 48 kHz are used in digital devices such as digital audio devices. For connecting devices which use different sampling frequencies together, it is necessary to convert a sample train outputted from a signal transmitting device to a sample train of a sampling frequency which is used in a receiving device. In a case, for example, where master recording data which has been recorded in a studio with a sampling frequency of 48 kHz is dubbed for recording on a Compact Disc, the sampling frequency must be converted to a frequency of 44.1 kHz.

Similarly, for connecting two digital devices which have the same sampling frequency but are driven by master clocks which are different from each other, it is necessary to synchronize a sample train outputted from a transmitting device with a sampling frequency of a receiving device and this requires a kind of sampling frequency conversion. In a case, for example, data is reproduced from a Compact Disc having a sampling frequency of 44.1 kHz and is dubbed by a digital recording device having the same sampling frequency of 44.1 kHz but is driven by a master clock which is different from one for the Compact Disc, sampling frequency conversion is required for synchronizing a digital signal reproduced from the Compact Disc with the sampling frequency of the digital recording device.

For converting a sampling frequency, there is a prior art method according to which an input sample train is digital-to-analog converted to convert a digital signal to an analog signal and this analog signal is analog-to-digital converted with a sampling frequency of an output sample train.

There is another prior art method fox converting a sampling frequency according to which an input sample train is oversampled to a sampling frequency which is the least common multiple of the input sample train and an output sample train and samples which constitute the output sample train are extracted from the sampling frequency which is the result of the oversampling.

The former prior art method of sampling frequency conversion has the disadvantage that it produces a large quantizing error due to double quantizing occurring in the digital-to-analog conversion and the subsequent analog-to-digital conversion with resulting generation of a large distortion in an acoustic signal.

The latter prior art method of sampling frequency conversion according to which an input sample train is oversampled has the disadvantage that a large scale of device is required except for a case where the ratio of an input sample train and an output sample train is a simple integer ratio.

There has also been proposed a method which is an improvement of the method using oversampling. According to this improved method, an input sample train is oversampled with a multiple which is chosen in a range which will not result in requirement for a large scale device and an interval between samples produced by this oversampling is interpolated with a linear interpolation to provide an output sample train. This proposed method, however, is disadvantageous in that the conversion accuracy is not so good because this method employs the linear interpolation with a result that distortion in a produced acoustic signal becomes relatively large.

It is, therefore, an object of the invention to overcome the above described disadvantages of the prior art sampling frequency converters and provide a sampling frequency converter which can achieve a high conversion accuracy with a relatively simple structure.

SUMMARY OF THE INVENTION

For achieving the above described object of the invention, a sampling frequency converter comprises oversampling means for oversampling an input sample train, a memory, write control means for writing oversampled data provided from said oversampling means in said memory with a clock synchronized with the oversampled data, sampling frequency ratio measuring means for measuring a frequency ratio of a sampling frequency of the input sample train and a sampling frequency of an output sample train, read control means for reading from said random access memory the oversampled data used for obtaining interpolation data at two points before and after an output sample value which realizes the measured sampling frequency ratio by a polynomial interpolation, polynomial interpolation means for obtaining the interpolation data at the two points by the polynomial interpolation on the basis of the oversampled data read from said memory by said read control means, and linear interpolation means for linear-interpolating between the polynomial interpolation data at the two points obtained by the polynomial interpolation and thereby obtaining the output sample value realizing the sampling frequency ratio.

According to the invention, an input sample train is oversampled with a pro:per multiple and samples formed by this oversampling are interpolated bt polynomial interpolation and, further, samples formed by the polynomial interpolation are interpolated by linear interpolation.

This arrangement enables a simple and compact circuit design as compared with a case where an output sample train is formed by oversampling only. Further, since the samples made by oversampling are not interpolated directly by linear interpolation but are interpolated first by polynomial interpolation and then by linear interpolation, the conversion accuracy is improved. Moreover, the circuit design can be made simple and compact by the employment of polynomial interpolation and linear interpolation as compared with a case where the same multiple is realized by oversampling only. Thus, according to the invention, a simple circuit design and an excellent conversion accuracy can both be achieved.

In one aspect of the invention, said sampling frequency ratio measuring means comprises a counter counting with a clock synchronized with the input sample train and providing a count of said counter for plural word periods of the output sample train as said sampling frequency ratio, said read control means uses, as read address data for reading said memory, high order data among three data obtained by dividing bits which are an accumulated value of counts of said counter accumulated for each output sample period, said polynomial interpolation means uses, as address data for reading a second memory storing an interpolation coefficient for effecting the polynomial interpolation, middle order data among the three data obtained by dividing the bits which are the accumulated value of the counts of said counter, and said linear interpolation means uses, as coefficient data for the linear interpolation, low order data among the three data obtained by dividing the bits which are the accumulated value of the counts of said counter.

According to this aspect of the invention, bits of accumulated counts obtained by counting a clock synchronized with an input sample train for plural word periods of an output sample train are divided in three data sections and these data sections are used, from high order data, as read address data for a random access memory for polynomial interpolation, read address data for a read-only memory storing a polynomial interpolation coefficient and coefficient data for linear interpolation. Production of interpolation data can thereby be facilitated.

In the above described sampling frequency conversion according to the invention, the accuracy of detection of the sampling frequency ratio directly influences the conversion accuracy and, accordingly, it is desirable to detect the sampling frequency ratio with a high accuracy.

In another aspect of the invention, therefore, there is provided a sampling frequency converter in which the accuracy of detection of the sampling frequency ratio is improved and thereby the conversion accuracy of the sampling frequency conversion is improved.

A sampling frequency converter according to this aspect of the invention comprises a random access memory, sampling frequency ratio measuring means for measuring a frequency ratio of a sampling frequency of an input sample train and a sampling frequency of an output sample train, read control means for reading from said random access memory an input sample necessary for obtaining an output sample value which realizes the measured sampling frequency ratio by interpolation on the basis of the sampling frequency ratio, and interpolation means for obtaining the output sample data by interpolation on the basis of the input sample data read from said random access memory by said read control means, said sampling frequency ratio measuring means comprising a counter counting a clock synchronized with the input sample, and count output means for measuring count of said counter for plural word periods of the output sample and outputting this count as a measured value of the sampling frequency ratio.

According to this aspect of the invention, a clock synchronized with the input sample is counted by a counter and a count for plural word periods of the output sample is used as a measured value of the sampling frequency ratio, so that influence of a rounding error can be reduced as compared with a case where a count for a single word period is measured whereby the number of digits of the measured value increases which enables improvement in resolution of the measured value of the sampling frequency ratio. Accordingly, the accuracy of detection of the sampling frequency ratio is improved and the conversion accuracy of the sampling frequency conversion is thereby improved.

In a case where a count for plural word periods of the output sample is measured as the sampling frequency ratio, the measured value sometimes does not follow a change in the sampling frequency ratio when such change occurs and this adversely affects the accuracy of detection rather than improves it. In another aspect of the invention, therefore, said sampling frequency ratio measuring means comprises sampling frequency ratio variation detection means for detecting variation in the measured sampling frequency ratio and sampling frequency ratio measuring period control means for prolonging the plural word periods of the output sample during which the sampling frequency ratio is measured when variation in the sampling frequency ratio is small and shortening the plural word periods of the output sample when variation in the sampling frequency ratio is large.

According to this aspect of the invention, variation in the sampling frequency ratio is detected and, when the variation is large, the length of the plural word periods for measuring the sampling frequency ratio is shortened and the measured value of the sampling frequency ratio can thereby follow the variation in the sampling frequency ratio sufficiently.

When an input sample train is successively written in a memory and an output sample train is formed by reading the input sample train from the memory and interpolating the read out sample train, variation in the sampling frequency ratio sometimes causes a read address for the memory to outrun a write address or, conversely, causes a read address to be outrun by the write address. In either case, discontinuity occurs in output data with resulting occurrence of a large noise.

In another aspect of the invention, therefore, said read control means comprises address difference detection means for detecting difference between a write address and a read address for said random access memordy, and read address correction means for correcting, upon detection of approaching of the read address within a predetermined range toward the write address on the basis of the detected address difference, the read address in a direction in which the read address is withdrawn from the write address.

According to this aspect of the invention, by detecting difference between a read address and a write address and correcting the read address in a direction in which the read address is withdrawn from the write address when the address difference has approached to the write address within a predetermined range, outrunning between the read address and the write address can be prevented and generation of a large noise thereby can be prevented.

Preferred embodiments of the invention will be described below with reference to the accompanying drawings.

BRIEF DESCRIPTION OF THE DRAWINGS

In the accompanying drawings, is

DESCRIPTION OF PREFERRED EMBODIMENTS

Figure 1:
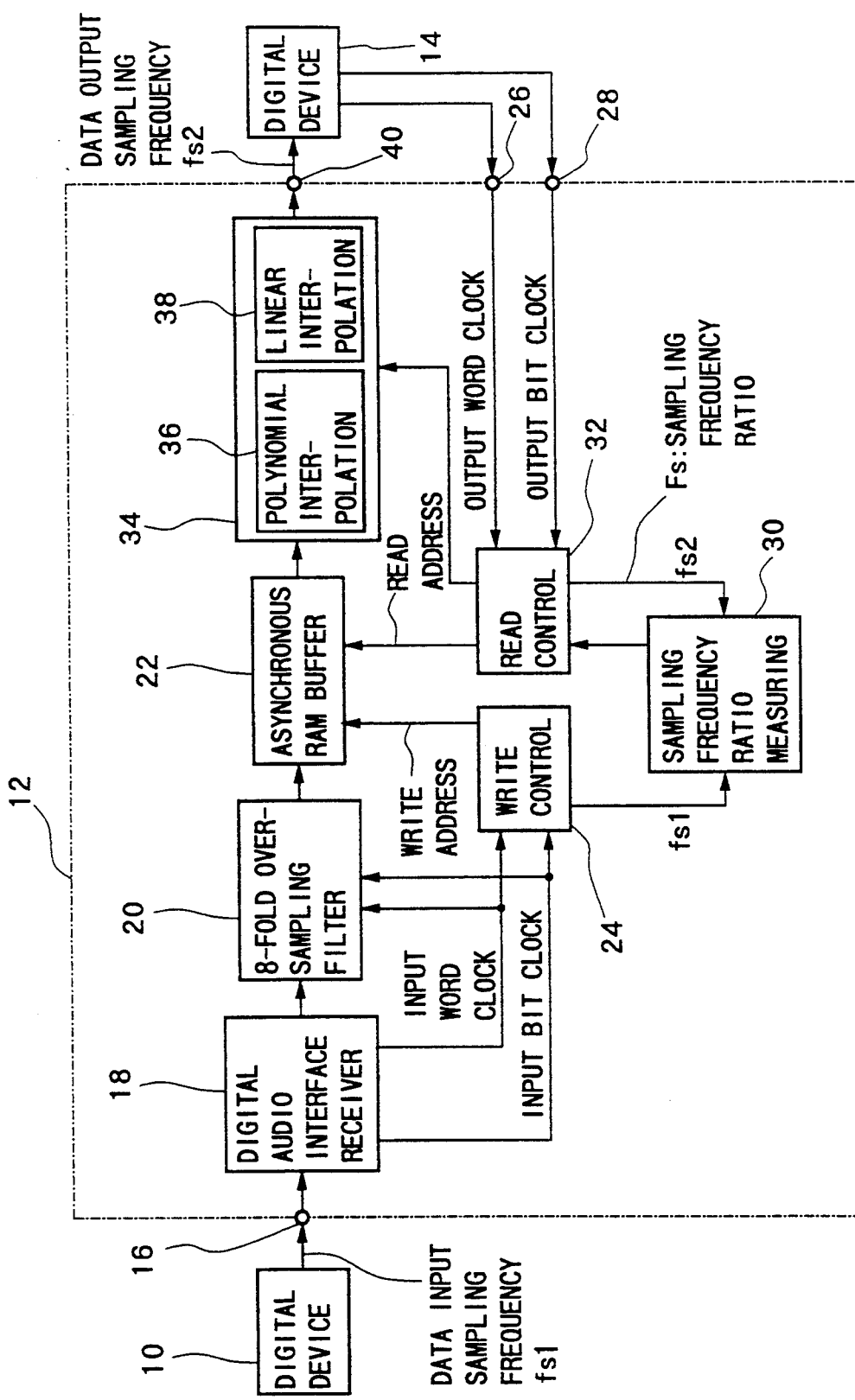
FIG. 1 a block diagram showing an embodiment of the invention.

An outline of an embodiment of the invention is shown in FIG. 1. In this embodiment, data outputted from a digital device 10 (e.g., digital audio playback device) which is operated with a sampling frequency fs1 is converted to a sampling frequency fs2 by a sampling frequency converter 12 and is applied to a digital device 14 (e.g., digital audio recording device or digital audio mixer) which is operated with the sampling frequency fs2.

Data outputted from the digital device 10 (input sample train) is applied through a data input terminal 16 to the sampling frequency converter 12 and is synchronized with an internal clock of the sampling frequency converter 12 by a digital audio interface receiver 18. More precisely, an internal clock is synchronized with a clock of input digital data by phase-locked loop. An input word clock (a clock having a frequency of fs1) and an input bit clock are reproduced by the digital audio interface receiver. The input bit clock is a clock of minimum unit of input data, i.e., reproduced clock or the like and, in this embodiment, a clock which is 256-fold as high as the input word clock is reproduced.

The input sample train which is synchronized with the internal clock is eightfold-oversampled by an eightfold oversampling filter 20 (oversampling means) and written sequentially in an asynchronous RAM buffer 22 (RAM). A write control circuit 24 controls this writing and designates a write address to the asynchronous RAM buffer 22 in accordance with the input word clock.

The digital device 14 outputs an output word clock i.e., a clock of sampling frequency fs2 used in the digital device 14, and an output bit clock which is a clock of minimum unit used in the digital device 14. The output word clock and the output bit clock are applied to clock input terminals 26 and 28. A sampling frequency ratio measuring circuit 30 compares the sampling frequency fs1 on the input side with the sampling frequency fs2 on the output side and thereupon provides data representing sampling frequency ratio Fs.

The read control circuit 32 controls reading from the asynchronous RAM buffer 22 the eightfold oversampled data necessary for forming an output sample train which realizes the measured sampling frequency ratio Fs. The read control circuit 33 also controls outputting of a read address for the polynomial coefficient ROM and a coefficient for linear interpolation.

An interpolation operation section 34 produces interpolation data at two points before and after an object output sample with a polynomial interpolation circuit 36 by using the eightfold oversampled data read from the asynchronous RAM buffer 22. In this embodiment, Lagrange's seventh-order interpolation is employed as the polynomial interpolation. The polynomial (Lagrange's) interpolation data at the two points is then interpolated by linear interpolation by means of a linear interpolation circuit 38 to obtain the object output sample value.

In this manner, the output sample train which is successively outputted from the interpolation operation section 34 with the sampling frequency fs2 synchronized with the digital device 14 is outputted from a data output terminal 40 and applied directly to the digital device 14 for necessary processing.

Figure 2:
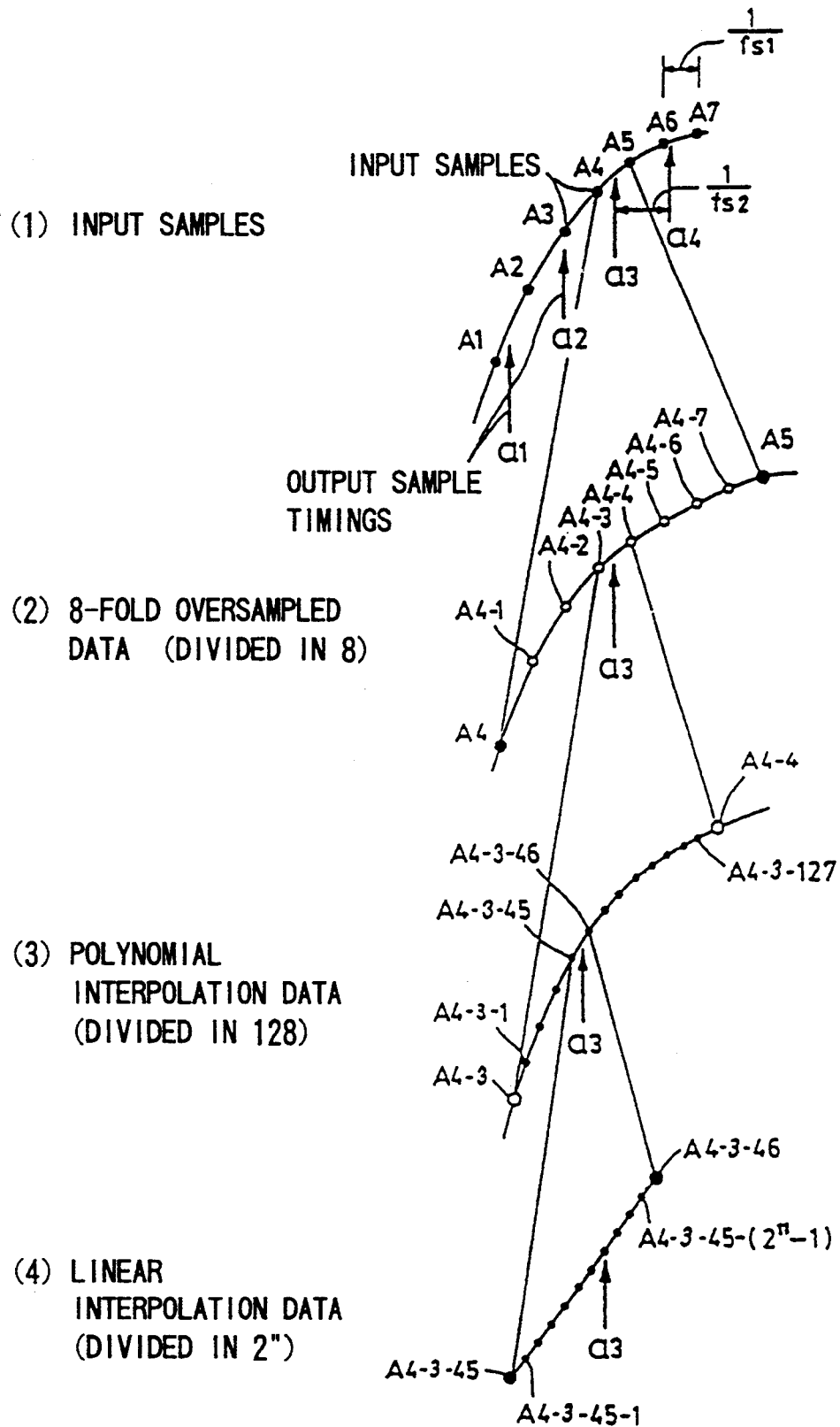
FIG. 2 is a diagram showing steps of sampling frequency conversion made by a sampling frequency converter 12 of FIG. 1.

Steps of the above described sampling frequency conversion are shown in FIG. 2.

The diagram of step (1) shows an input sample train A1, A2, . . . . It is intended here to convert this input sample train to an output sample train al, a2, . . . , having a different sampling frequency. Steps for forming an output sample a3 among the samples constituting the output sample train are illustrated by diagrams of Steps (2), (3) and (4).

In step (2), new samples A4-1, A4-2, . . . , A4-7 are inserted at equal interval by oversampling in a section between input samples A4 and A5 whereby the section between the samples A4 and A5 is divided into eight sections. By this oversampling, all oversampled data are produced successively irrespective of the sampling frequency ratio and written in the asynchronous RAM buffer 22.

The diagram of step (3) shows data obtained by performing Lagrange's seventh order interpolation for the oversampled data in a section between samples A4-3 and A4-4 in which the object output sample a3 is included. This diagram shows a case where one section of the oversampled data is equally divided into 128 sections by Lagrange's seventh order interpolation. In actual computation, all of interpolation data A4-3-1, A4-3-2, . . . , A4-3-127 are not calculated but data necessary for linear interpolation, i.e., interpolation data at two points before and after the object output sample a3 (A4-3-45 and A4-3-46) only are formed. Positions at which interpolation data should be formed are determined depending upon the sampling frequency ratio Fs as will be described more fully later.

The diagram of step (4) shows data obtained by linear interpolating the section-between the Lagrange's interpolation data A4-3-45 and A4-3-46. The diagram shows a case where a section between adjacent two points of the Lagrange's interpolation data is equally divided by $2^{11}$ by linear interpolation. In acutal computation, all of interpolation data A4-3-45-1, A4-3-45-2, . . . , A4-3-45-($2^{11}-1$) are not calculated but interpolation data of the object output sample a3 only is formed. Positions at which the interpolation data should be formed are determined depending upon the sampling frequency ratio Fs as will be described more fully later.

In the above described manner, the sample value of the output sample a3 is obtained with a high accuracy. Next output sample a4 can be obtained by computing an output sample at a time point which is apart from the output sample a3 by 1/fs2 in the same manner as described above.

Figure 3A:
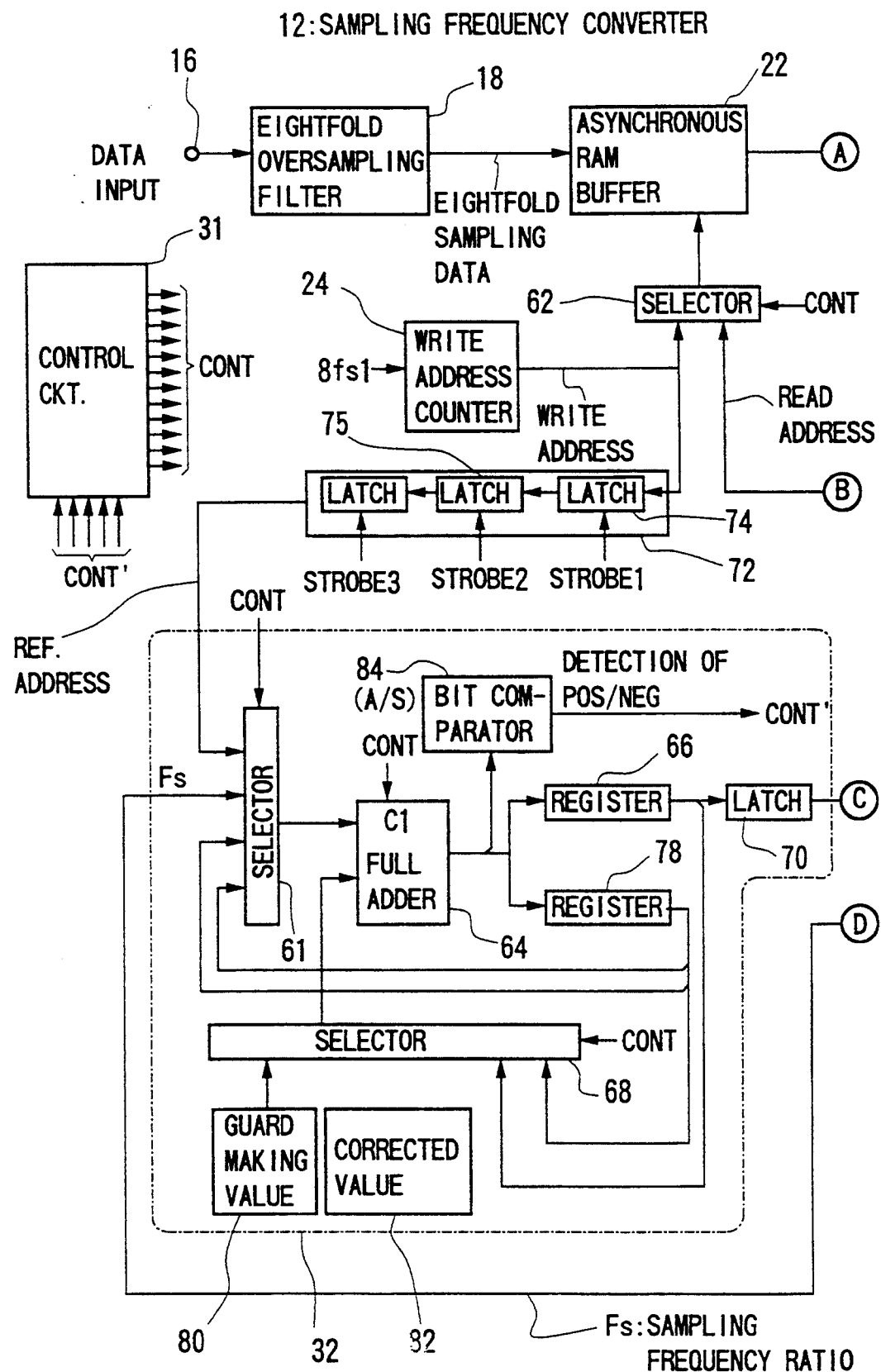
FIGS. 3A and 3B are block diagrams showing a specific example of construction of the sampling frequency converter 12 of FIG. 1.
Figure 3B:
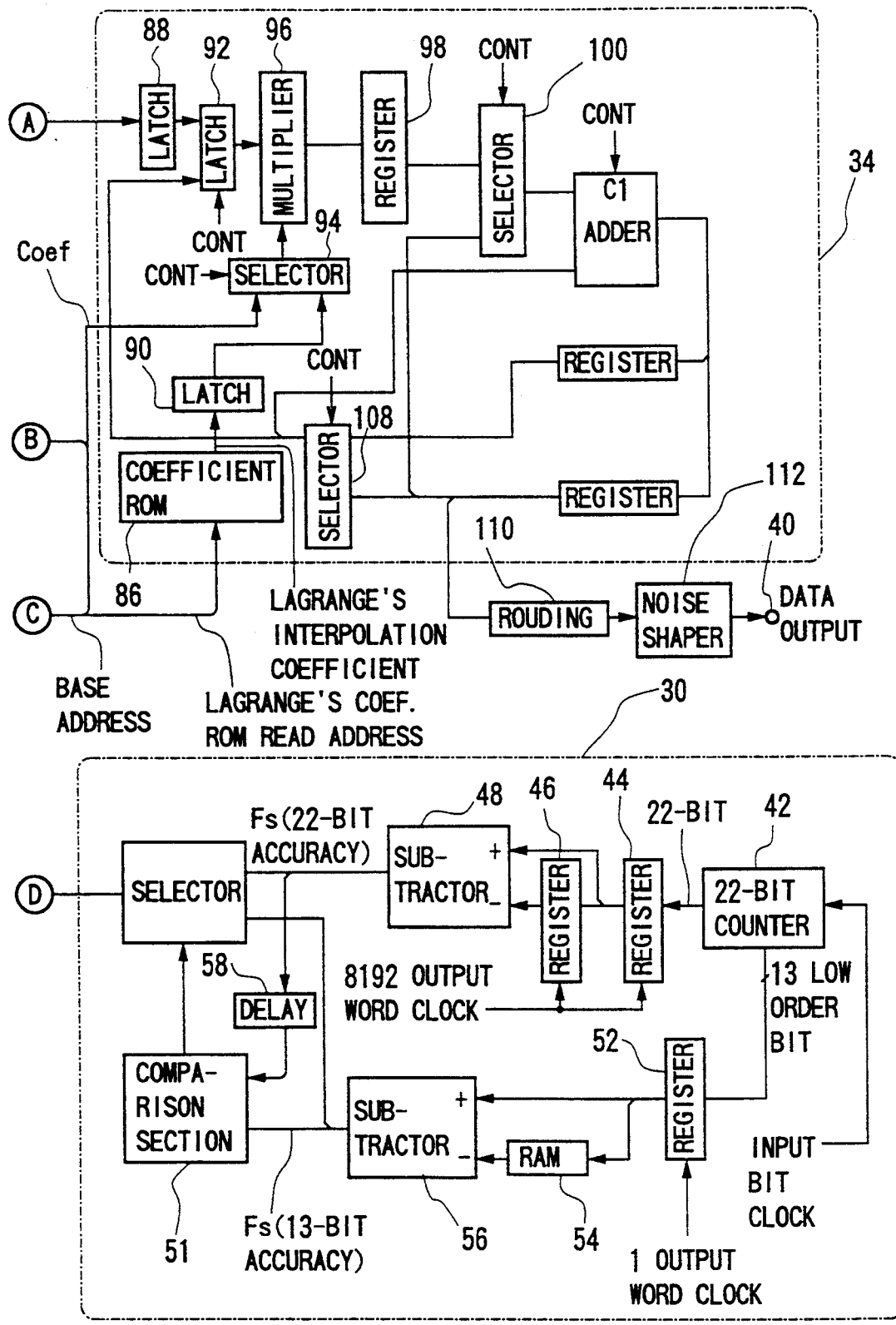

A specific example of the sampling frequency converter 12 is shown in FIGS. 3A-3B. Component parts of the sampling frequency converter 12 shown in FIGS. 3A-3B will now be described.

(1) Control circuit 31

The control circuit 31 supplies controls signals CONT to sections of the circuit of FIGS. 3A-3B for making a control necessary for performing predetermined operations of these sections. The control circuit 31 also receives signals CONT' from sections of the circuit of FIGS. 3A-3B.

(2) Sampling frequency ratio measuring circuit 30

The sampling frequency ratio measuring circuit 30 has a free-run counter 42 of 22-bit word length and measures the sampling frequency ratio Fs with this free-run counter 42. The free-run counter 42 is a cyclic counter which performs free running without resetting. This 22-bit counter 42 counts the input bit clock which has a frequency 256 times as high as the input sampling frequency fs1. The sampling frequency ratio measuring circuit 30 measures the counts of this 22-bit counter 42 within a period which is synchronized with the output sampling frequency fs2. This count increases when the input sampling frequency fs1 becomes higher (or when the output sampling frequency fs2 becomes lower) and decreases when the input sampling frequency fs1 becomes lower (or when the output sampling frequency fs2 becomes higher) and, therefore, this count corresponds to the frequency ratio Fs of the two sampling frequencies fs1 and fs2.

Figure 4:
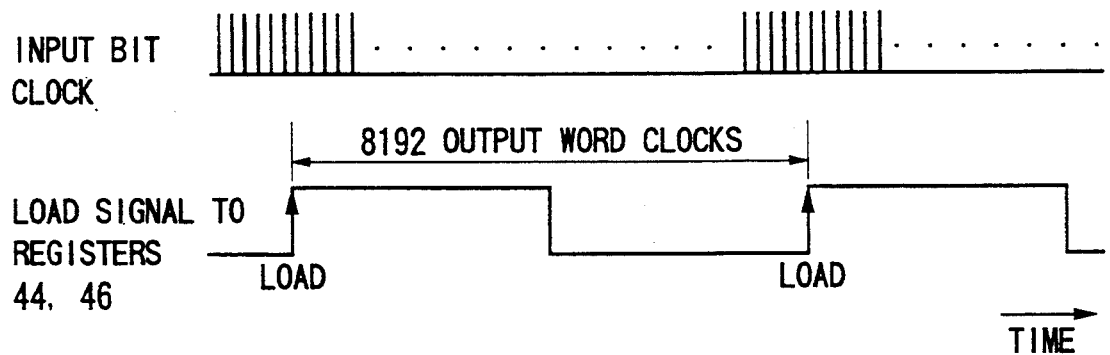
FIG. 4 is a time chart showing a state of measurement at 22-bit accuracy by a sampling frequency ratio measuring circuit 30 in FIG. 3B.

For improving accuracy of measurement (resolution) of the sampling frequency ratio Fs, in this embodiment, a long period of 8192 output word clocks is used as a measuring period of one measurement as shown in FIG. 4 and, during this period, the count counted by the 22-bit counter 42 is outputted as an average value of the sampling frequency ratio Fs within the 8192 output word clocks.

This measurement is specifically performed in the following manner: In FIG. 3A-3B, the count of the 22-bit counter 42 is successively transferred to registers 44 and 46 every 8192 output word clocks. A subtractor 48 which constitutes the count outputting means performs subtraction between counts held in the registers 44 and 46 and outputs the count of the 22-bit counter 42 in the immediately preceding period of 8192 output word clocks as data of the sampling frequency ratio Fs. Accordingly, data of the sampling frequency ratio Fs is renewed every 8192 output data word.

The data of the sampling frequency ratio Fs is supplied to the read control circuit 32 through a selector 60 and is used for determining a read address for the asynchronous RAM buffer 22, a read address for a Lagrange's seventh order interpolation coefficient ROM 86 and a linear interpolation coefficient Coef.

In a case where the sampling frequency ratio Fs is subjected to an abrupt change on time bases for some reason, if the sampling frequency ratio Fs is measured every 8192 output word clocks, the measured value will not be able to follow the change in the sampling frequency ratio Fs and, as a result, the measured value will not represent an accurate sampling frequency ratio FS at that time point. Consequently, in the asynchronous RAM buffer 22, the read address may outrun the write address or may be outrun by the write address and this will result in occurrence of a large noise.

For overcoming this problem, it is conceivable to store counts of the 22-bit counter 42 at each output word clock in a RAM successively for the past 8192 times, calculate, every output word clock, difference between the current count and a count of 8192 output word clocks before and output this difference as the sampling frequency ratio Fs at each time point. By this method, new sampling frequency ratio Fs can be obtained every word clock so that the measured value can sufficiently follow the change in the sampling frequency ratio Fs. This method, however, has the disadvantage that it requires a RAM of a large storage capacity.

Figure 5:
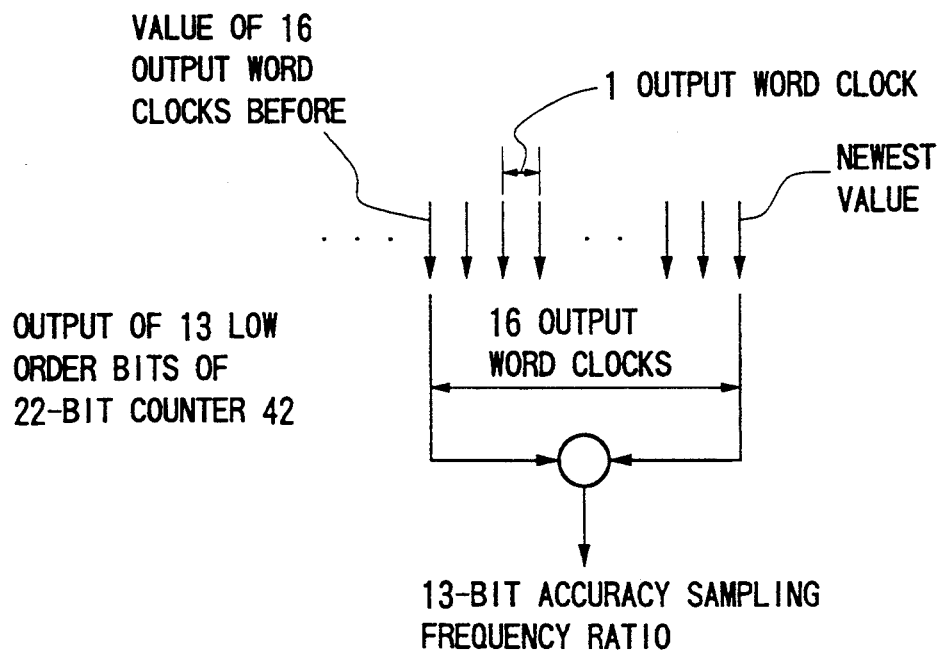
FIG. 5 is a diagram showing schematically a state of measurement at 13-bit accuracy by the sampling frequency ratio measuring circuit 30.

Therefore, a method for enabling the measured value to follow the change in the sampling frequency ratio Fs sufficiently without requiring a RAM of a large storage capacity is proposed below. According to this method, as shown in FIG. 5, a period of measuring the sampling frequency ratio Fs consists of 16 output word clocks, the count of the 22-bit counter 42 at each output word clock is successively stored in a RAM over the past 16 times and difference between the current count and a count of 16 word clocks before is calculated every output word clock and this difference is outputted as data of the sampling frequency ratio Fs at each time point.

By this arrangement, new sampling frequency ratio Fs can be obtained every output word clock so that the measured value can sufficiently follow the change in the sampling frequency ratio Fs. Further, by this arrangement, time elapsed for averaging the sampling frequency ratio Fs is shortened (i.e., from 8192 output word clocks to 16 output word clocks), so that resolution appears to be lowered. However, in a case where the frequency ratio is changing, influence of the change becomes stronger when the time for averaging is shorter and, as a result, a measured value which is nearer to an actual sampling frequency ratio Fs can be obtained. If, however, the time for averaging is too short, influence of jitter will become significant. In this embodiment, therefore, the period of 16 output word clocks is employed as a value at which influence of jitter is not significantly felt.

Since the count of $16(=2^4)$ output word clocks has a magnitude of $2^4-2^{13}=2^{-9}$ as compared with the count of $8192(=2^{-9})$ output word clocks, when measurement is made at the 16 output word clocks, for matching the order, the output of low order 13 bits of the 22-bit counter 42 excluding 9 high order bits is shifted up by 9 bits and this value is used as the sampling frequency ratio Fs.

The sampling frequency ratio measuring circuit 30 in FIG. 3A-3B performs the measurement by 16 output word clocks in the following manner. A register 52 has an output of low order 13 bits of the 22-bit counter 42 loaded therein every one output word clock. In a RAM 54, the count loaded in the register 52 is successively written and the RAM 54 always holds past 16 counts as viewed from the current time point. A subtractor 56 obtains difference between the oldest count and the newest count stored in the RAM 54 (i.e., count within the period of 16 output word clocks) and outputs this value as an average value of the sampling frequency ratio Fs in this period, renewing this value every output word clock. By this arrangement, in a case where the sampling frequency ratio Fs i s changed, a measured value which instantly follows this change is provided from the subtractor 56.

Figure 6:
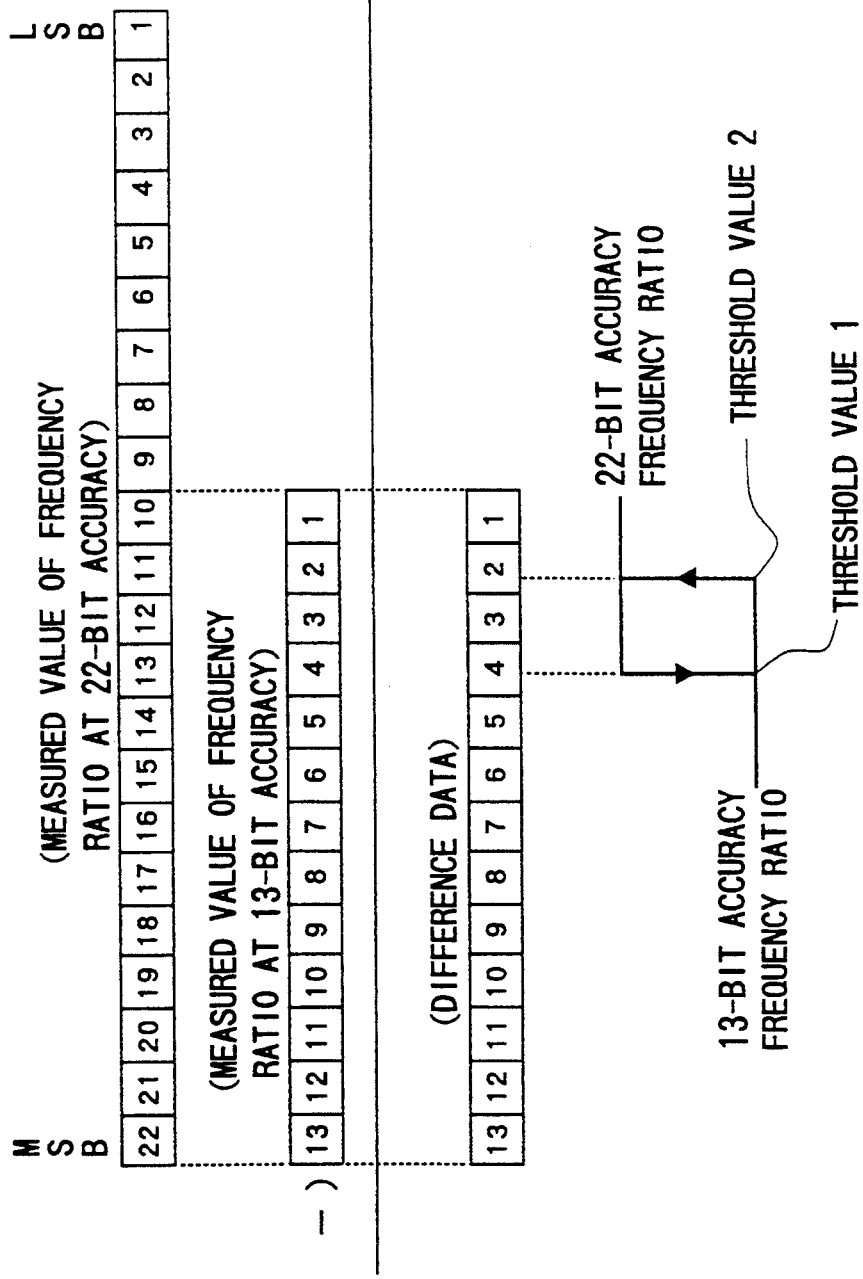
FIG. 6 is a diagram showing an accuracy switching operation in measuring the sampling frequency ratio by a comparison section 51 in FIG. 3B.

Detection of change in the sampling frequency ratio Fs is made in the following manner. A comparator 51 which constitutes the sampling frequency ratio variation detection means and the sampling frequency ratio measuring period control means performs subtraction between a measured value of the sampling frequency ratio Fs of 22-bit accuracy and a measured value of the sampling frequency ratio Fs of 13-bit accuracy which is renewed every output word clock with the order of the two measured values being matched to each other as shown in FIG. 6 and outputs difference data of 13 bits. This difference data becomes a small value when the change in the sampling frequency ratio Fs is small and becomes a large value when the change in the sampling frequency ratio Fs is large. In the comparison section 51, therefore, upper and lower threshold values 1 and 2 are provided as shown in FIG. 6. Measurement of the sampling frequency ratio Fs is normally made (i.e., 22-bit accuracy sampling frequency ratio measured data is outputted from the selector 60). When, in this state, the difference data exceeds the threshold value 1 (11 bits), the change is considered to be large enough and the measurement is switched from the 22-bit accuracy measurement to the 13-bit accuracy measurement (i.e., 13-bit accuracy sampling frequency ratio measured data is outputted from the selector 60). When the difference data falls below the threshold value 2 (13 bits) during measurement at the 13-bit accuracy, the change is considered to be small enough and the measurement is restored form the 13-bit accuracy to the 22-bit accuracy. In this manner, measurement of the sampling frequency ratio Fs is made following a kind of hysteresis curve. By this arrangement, even in a case where, for example, the sampling frequency Fs has undergone continuous change by the use of a variable pitch in a digital recording device, the measurement is instantly switched to the 13-bit accuracy sampling frequency ratio which follows the change sufficiently and, as a result, occurrence of a noise which causes acoustically adverse effects can be prevented, though there occurs distortion of a minor degree.

A delay circuit 58 delays the 22-bit accuracy sampling frequency ratio measured value by 3 samples (=8192 output word clocks ×3). This delay is made for restoring the measurement from the 13-bit accuracy to the 22-bit accuracy after restoration to a stable state is ensured once the change in the sampling frequency ratio Fs has caused the measurement to be switched from the 22-bit accuracy to the 13-bit accuracy. More specifically, when the sampling frequency ratio Fs has changed in a state in which the measurement is made with the 22-bit accuracy, its influence instantly appears in the measured value of the 13-bit accuracy, so that the difference data increases and the measurement is switched to the 13-bit accuracy measurement. In contrast thereto, when the sampling frequency ratio Fs is restored to a stable state from a state in which measurement is made with the 13-bit-accuracy, the measured value of 13-bits is instantly restored to a stable state but the measured value of 22-bit accuracy is not restored to a stable state instantly because it is delayed by 3 samples by the delay circuit 58 with a result that the difference data remains at a large value so that the measurement at 13-bits is continued. After lapse of 3 samples, the measured value at 22-bit accuracy is restored also to a stable state, so that the difference data decreases and the measurement is restored to the measurement at 22-bit accuracy. In this manner, the switching timing follows a kind of hysteresis curve. The delay time is not limited to 3 samples but may be determined at any suitable value.

(3) Write control circuit 24

A write address counter 24 constitutes the write control circuit 24 and counts a clock which has a frequency eightfold as high as fs1 and is synchronized with the eightfold oversampled data and outputs the count as write address data. The write address data is supplied successively to the asynchronous RAM buffer 22 through a selector 62 whereby eightfold oversampled input data is successively written in the asynchronous RAM buffer 22.

(4) Read control circuit 32

The measured sampling frequency ratio Fs represents an interval at which an output sample-train should be outputted relative to an input sample train, so that the output sample train can be generated by performing reading of the asynchronous RAM buffer 22 and imparting of an interpolation coefficient by utilizing the measured sampling frequency ratio Fs.

For this purpose, the read control circuit 32 in FIG. 3A accumulates measured data of the sampling frequency ratio Fs outputted from the sampling frequency ratio measuring circuit 30 for each period of the output sampling frequency fs2 and outputs, every output sampling period, the accumulated value as base address data which is a combination of read address data for the asynchronous RAM buffer 22, read address data for the Lagrange's seventh order interpolation coefficient ROM and linear interpolation coefficient data. In this case, when the sampling frequency ratio Fs is measured at the 22-bit accuracy, the measured value is renewed every 8192 output word clock, so that the same measured value is accumulated 8192 times during a period until the measured value is renewed. When the sampling frequency ratio Fs is measured at the 13-bit accuracy, the measured value is renewed every output word clock, so that this measured value is successively accumulated.

Figure 7:
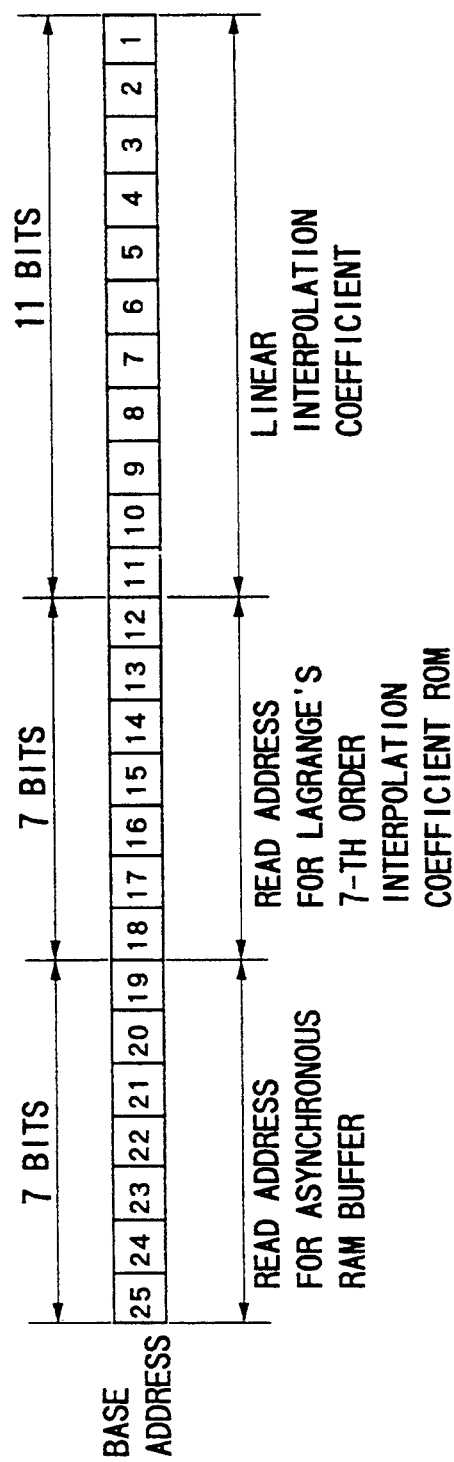
FIG. 7 is a diagram showing structure of base address generated by a read control circuit 32 in FIG. 3A.

The structure of the base address data is shown in FIG. 7. As described above, the base address is formed by accumulating, every output word clock, the 22-bit measured value of the sampling frequency ratio Fs (in the case of the 13-bit accuracy, the measured value is made 22-bit by adding 9 bits of "0" at the least significant bit) and the entire base address consists of 25 bits. Since the measured value of the sampling frequency ratio Fs is a value obtained by counting the input bit clock which is thirtytwofold ($=2^5$) of the eightfold oversampled data over 8192 ($=2^{13}$) output word clocks, a value of $\frac{1}{2^{18}}$ of the base address corresponds to one sample which is data obtained by eightfold oversampling the input sample train and stored in the asynchronous RAM burruer 22. Accordingly, 7 high order bits of the base address are used as read address for the asynchronous RAM buffer 22 ($2^7=128$ addresses in all) and 18 low order bits are used as interpolation data used for dividing the interval of samples obtained by eightfold oversampling by $2^{18}$. High order 7 bits of the 18-bit interpolation data are used as read address for the ROM 86 storing the coefficient of the Lagrange's seventh order interpolation for dividing the interval between the samples obtained by eightfold oversampling by $2^7=128$, and low order 11 bits of the 18-bit interpolation data are used as the linear interpolation coefficient Coef for dividing the interval between the two samples obtained by Lagrange's seventh order interpolation by $2^{11}=2048$ (see FIG. 2).

The generation of the base address by the read control circuit 32 will now be described. The measured value of the sampling frequency ratio Fs outputted by the sampling frequency ratio measuring circuit 30 is applied to one input terminal of a full adder 64 through a selector 61. To another input terminal of the full adder 64 is applied through a selector 68 a preceding accumulated value held in the register 66. The full adder 64 adds the two inputs and causes the register 66 to hold the sum as a new accumulated value. This accumulation is made every output word clock. The accumulated value held in the register 66 is transferred as the base address to a latch circuit 70 every output word clock. 7 high order bits of the base address are supplied as the RAM read address to the asynchronous RAM buffer 22 through the selector 62, 7 middle order bits are supplied as the read address for the Lagrange's interpolation coefficient ROM 86 and 11 low order bits are supplied as the linear interpolation coefficient Coef to the interpolation operation section 34.

(5) Asynchronous RAM buffer 22

Figure 8:
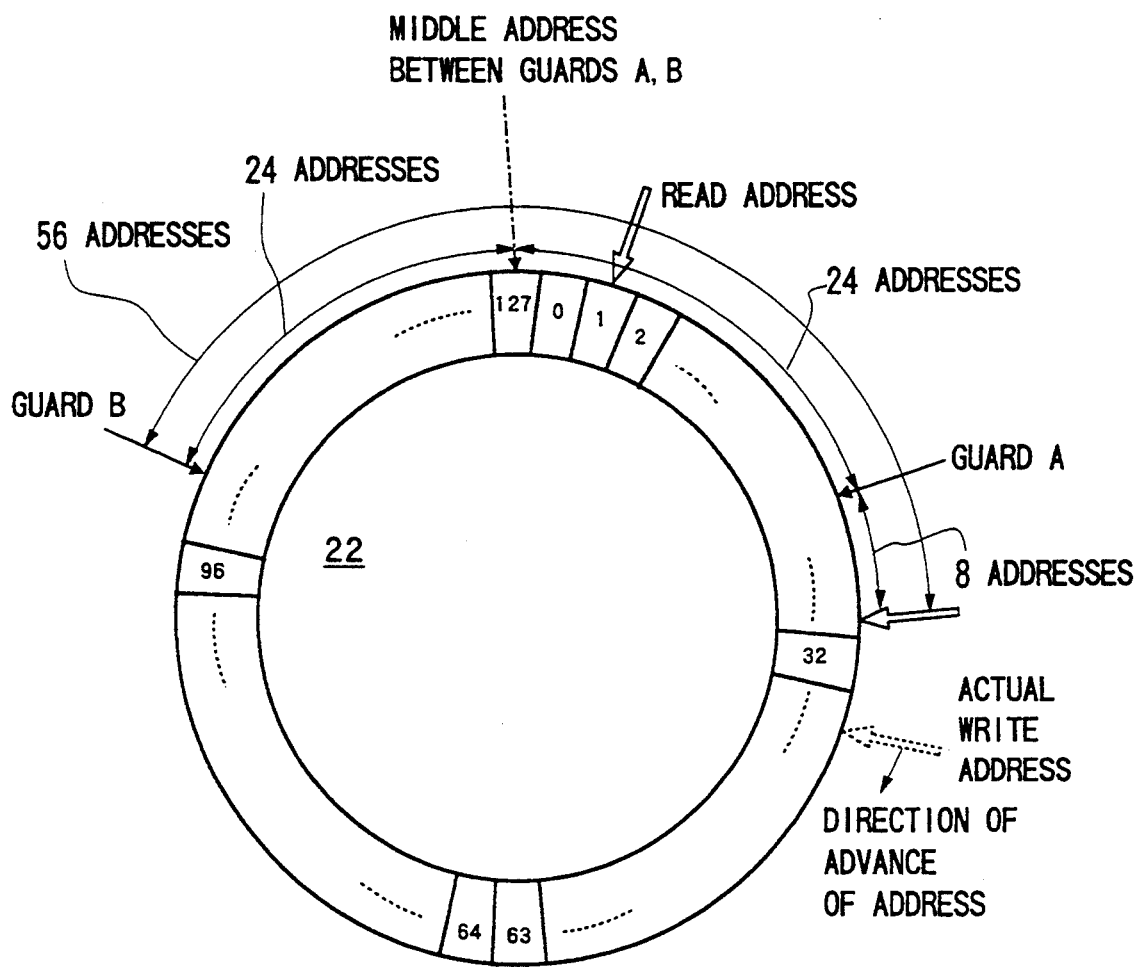
FIG. 8 is a diagram for explaining structure of an asynchronous RAM buffer 22 in FIG. 3A and relation between write address and read address.

The asynchronous RAM buffer 22 is constructed, as shown in FIG. 8, of a ring buffer having 128 addresses in all. The eightfold oversampled data is successively written in the buffer 22 and data necessary for Lagrange's seventh order interpolation is successively read from the buffer 22. For the operation of Lagrange's seventh order interpolation, oversampled data of 4 samples before and after an object output sample totalling 8 samples is used. The read address consisting of 7 high order bits of the base address designates, for example, the address of oversampled data immediately before the object output sample. Therefore, 8-sample data including this data at this address, data at three addresses before this address and data at four addresses after this address is successively read out for forming one output sample.

When there is no change in the sampling frequency ratio Fs between input and output samples, there is maintained a certain constant distance between the write address and the read address. When, however, there is change in the samplong frequency ratio Fs, the write address sometimes outruns the read address or is outrun by the read address. In either case, discontinuity occurs in the data which causes a noise.

For preventing this, guards are provided on both sides of the write address and apart from the write address by a certain distance. When any address of 8 eightfold oversampled data read by the read address or an address of eightfold oversampled data immediately before the object output sample has entered a region inside of the guards, this address is compulsorily moved outside of the guards. By this arrangement, the read address is corrected to prevent outrunning of the address and thereby preventing occurrence of a noise.

More specifically, correction of the read address is made in the following manner. Write address information which is outputted from the write address counter and is synchronized with the input side clock is converted by an asynchronous address latch circuit 72 to data synchronized with the output side clock. The asynchronous address latch circuit 72 is constructed of three serially connected latch circuits 74 to 76 and causes the write address information to synchronize with the output side clock by transferring the write address information successively with strobe signals 1 to 3.

Figure 9:
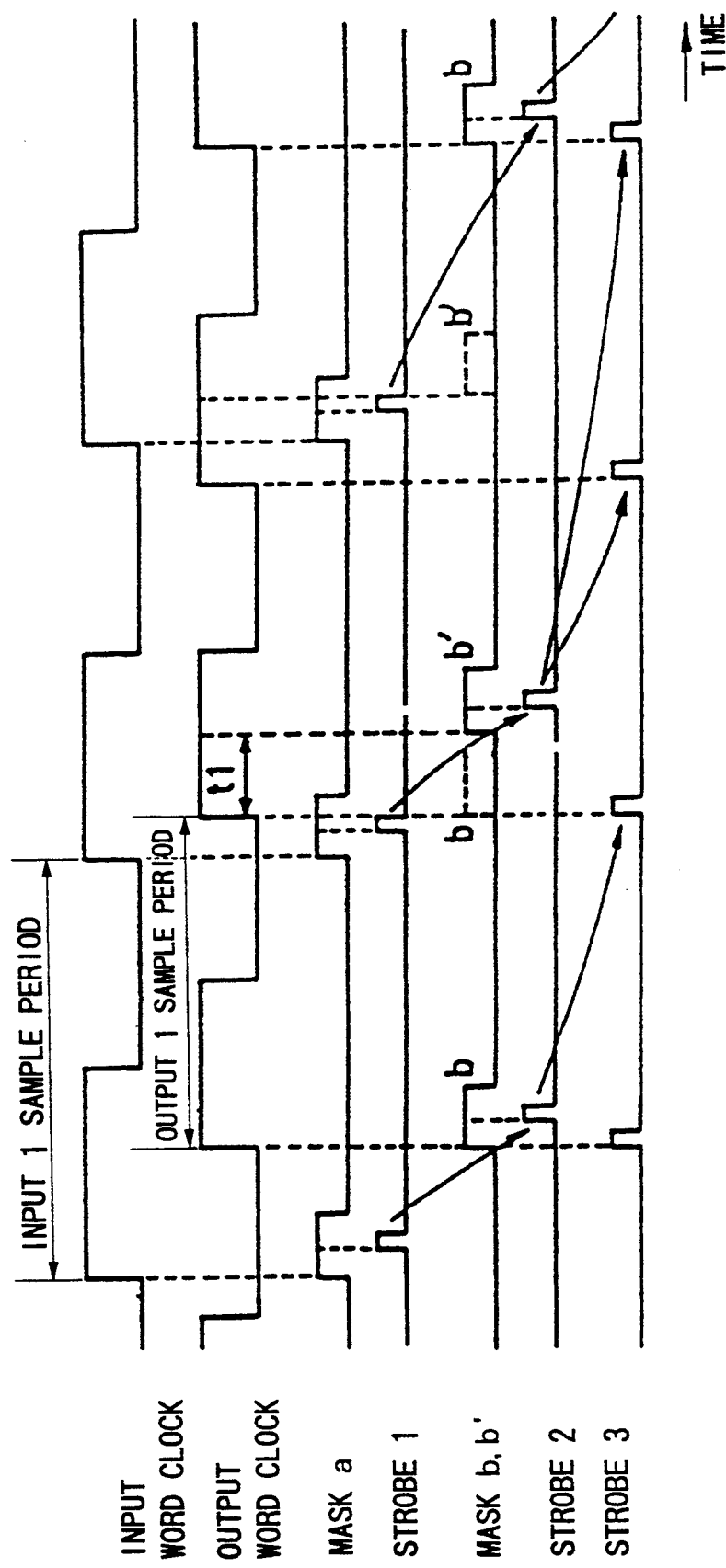
FIG. 9 is a diagram showing operation of an asynchronous address latch circuit 72 in FIG. 3A.

The operation of the asynchronous address latch circuit 72 is shown in in FIG. 9. The strobe signal 1 latching the write address information to the latch circuit 74 is produced at a timing synchronized with the input word clock. At a rise timing of the input word clock, a mask a of a predetermined period is started. In the middle portion of the mask a, the strobe signal 1 is produced and the write address information is thereby latched in the latch circuit 74. The strobe signal 2 transferring the write address information from the latch circuit 74 to the latch circuit 75 is produced at a timing synchronized with the output word clock. A mask b having a predetermined period is started at a rise timing of the output word clock and the strobe signal 2 is produced in the middle portion of the mask b thereby causing the write address information to be transferred from the latch circuit 74 to the latch circuit 75. The strobe signal 3 is produced at a rise timing of the output word clock and causes the write address information to be transferred from the latch circuit 75 to the latch circuit 76. In this manner, the write address information is converted to data synchronized with the ouptut side clock.

The masks a and b are provided for preventing concurrent occurrence of the latch timings of the latch circuits 74 and 75. When the timing of the mask b comes during the period of mask a, the mask b is not started but a substituting mask b' is started at a timing which is delayed by a predetermined time length t1 and the strobe signal 2 is produced in the middle of the mask b'. The mask a is a fixed mask which is started always at the rise timing of the input word clock. Once the substituting mask b' is produced, timings of the mask a and the mask b' are compared nextly and, when the timing of the mask b' comes during the period of the mask a, the mask b' is not started but a next mask b is started. In this manner, the write address information is transferred from the latch circuit 74 to the latch circuit 75 with concurrent occurrence of the respective latch timings being avoided and the write address information correctly synchronized with the output word clock is provided from the latch circuit 76.

Upon generation of the write address information which is correctly synchronized with the output side clock by the asynchronous address latch circuit 72, guards are formed by utilizing this write address information as a reference address (i.e., a hypothetical write address). As shown in FIG. 8, an address which is behind the reference address (which is slightly delayed from the actual write address) by 8 addresses is determined as guard A and an address which is behind the guard A by 48 addresses (56 addresses behind the reference address) is determined as guard B. When the read address gains to approach the write address and passes over the guard A, the read address is compulsorily withdrawn from the guard A by delaying the read address by, for example, 4 addresses. When the read address is delayed to approach the write address in the reverse direction and passes over the guard B, the read address is compulsortly withdrawn from the guard B by advancing the read address by, for example, 4 addresses. After withdrawing of the read address from the guard A or B by this major correction value −4 or +4, a minor correction is continuously made in the output word clock at a rate of, for example, −1 or +1 address per several output word clocks whereby the read address is restored to address "127" which is a middle address between the guards A and B. This correction operation is performed each time the read address has passed over the guard A or B. By this correction operation, the read address is held between the guards A and B and outrunning between the write address and the read address and resulting occrrence of a noise can thereby be prevented.

There occurs distortion in an output signal by this correction. The distortion is small as compared with a case where the read address outruns the write address or is outrun by the write address (there is a change of 138 samples) because there occurs a change of at most 4 samples only. Further, after making correction of 4 addresses once for preventing outrunning between the read address and the write address, the read address is corrected toward the central address "127" at a small rate of one address per several output word clocks, so that there occurs little distortion in the output waveform during this operation. Thus, correction of the read address is made without sacrificing continuity of the output waveform.

The above described correction of the read address is performed by the read control circuit 32. For making this correction of the read address, the read control circuit 32 comprises a register 78 for forming the guards A and B, a memory 80 storing values 8 and 56 of the guards A and B and a memory 82 storing major correction values of +4 and −4 addresses and minor correction values of +1 and −1address. The correction of the read address by the read control circuit 32 is made in the following processing in accordance with a command from the control circuit 31. This correction operation is made each time new base address is held in the register 66 (i.e., each time an output sample is formed) within a period during which the base address is transferred to the latch circuit 70.

(i) Computation of the guard A

As numerical value for forming the guard A, "8" is read from the memory 80 and applied to one input terminal of the full adder 64 through the selector 68. The reference address obtained by converting the write address to data synchronized with the output side clock is applied to the other input terminal of the full adder 64 through the selector 62. The full adder 64 subtracts "8" from the reference address and causes the difference to be held by the register 78 as the address of the guard A.

(ii) Comparison of the guard A with the read address

The address of the guard A held by the register 78 is supplied to one input terminal of the full adder 64 through the selector 68. The base address (not the 7 high order bits used as the RAM read address but all of 25 bits) held by the register 66 is supplied to the other input terminal of the full adder 64 through the selector 62. The full adder 64 performs a subtraction of (the address of the guard A)−(the base address) with respect to a corresponding bit. A bit comparator 84 which constitutes the address difference detection means discriminates a positive or negative sign of result of the subtraction and, when the sign is negative, judges that the base address has approached the write address passing over the guard A and performs correction of the base address. More specifically, the correction value −4 is read from the memory 82 and is applied to one input terminal of the full adder 64 through the selector 68. The data of the register 66 (base address value) is applied to the other input terminal of the full adder 64 through the selector 62. The full adder 64 makes correction by adding the correction value −4 to the data of the register 66 and causes the result of the correction to be held by the register 66. The correction of the RAM read address (actually as the entire base address) is made in the above described manner and the result of the correction is transferred from the register 66 to the latch circuit 70. When the result of the operation is positive, no correction made but the result of the operation is transferred directly to the latch circuit 70.

After making the major correction of −4, the minor correction value −1 is read from the memory 82 each time several output samples are formed and correction of the base address is performed in a similar manner to bring the address to the middle address "127" between the guards A and B. When the address has reached "127" or passed over it, the correction operation is finished. In the event that the base address has passed over the guard A in the course of this minor correction, correction is resumed from the correction using the major correction value.

(iii) Computation of the guard B

As numerical value for forming the guard B, "56" is read from the memory 80 and applied to one input of the full adder 64 through the selector 68. The reference address obtained by converting the write address to data synchronized with the output side clcok is applied to the other input terminal of the full adder 64 through the selector 62. The full adder 64 subtracts "56" from the reference address and causes the result of subtraction to be held by the register 78 as the address of the guard B.

(iv) Comparison of the guard B with the RAM read address

The address of the guard B held by the register 78 is applied to one input terminal of the full adder 64 through the selector 68. The base address (not the 7 high order bits used as the RAM read address but the entire 25 bits) held by the register 66 is applied to the other input terminal of the full adder 64 through the selector 62. The full adder 64 performs subtraction (the base address)−(the address of the guard B) with respect to a corresponding bit. The bit comparator 84 discriminates a positive or negative sign of the result of the operation and, when the sign is negative, judges that the base address has approached the write address passing over the guard B and performs correction of the base address. The correction value +4 is read from the memory 82 and applied to one input terminal of the full adder 64 through the selector 68. The data of the register 66 (base address value) is applied to the other input terminal of the full adder 64 through the selector 62. The full adder 64 makes correction by adding the correction value +4 to the data of the register 66 and causes the result of correction to be held by the register 66. In this manner, correction of the RAM read address (actually the entire base address) is made and the result of correction is transferred from the register 66 to the latch circuit 70. When the result of the operation is positive, no correction is made but the result of the operation is transferred directly to the latch circuit 70.

After making the major correction of +4, the minor correction value +1 is read from the memory 82 each time several output samples are formed and correction of the base address is performed in a similar manner to bring the address to the middle address "127" between the guards A and B. When the address has reached "127" or passed over it, the correction operation is finished. In the event that the base address has passed over the guard B in the course of this minor correction, correction is resumed from the correction using the major correction value.

(6) Interpolation operation section 34

The interpolation operation section 34 performs Lagrange's seventh order polynomial interpolation and linear interpolation. Lagrange's seventh order interpolation produces, for example, interpolation data which divides an interval between respective eightfold oversampled data by 128 by performing a convolution operation with respect to eightfold oversampled data A4, A4-1, A4-2, ..., A4-7 as shown in part (b) of FIG. 10 read from the asynchronous RAM buffer 22 by using intepolation coefficients as shown in part (a) of FIG.. 10. In this example, description will be made only about an operation for obtaining interpolation data at two points before and after the output sample a3 necessary for subsequent linear interpolation (points A4-3-45 and A4-3-46).

Figure 10:
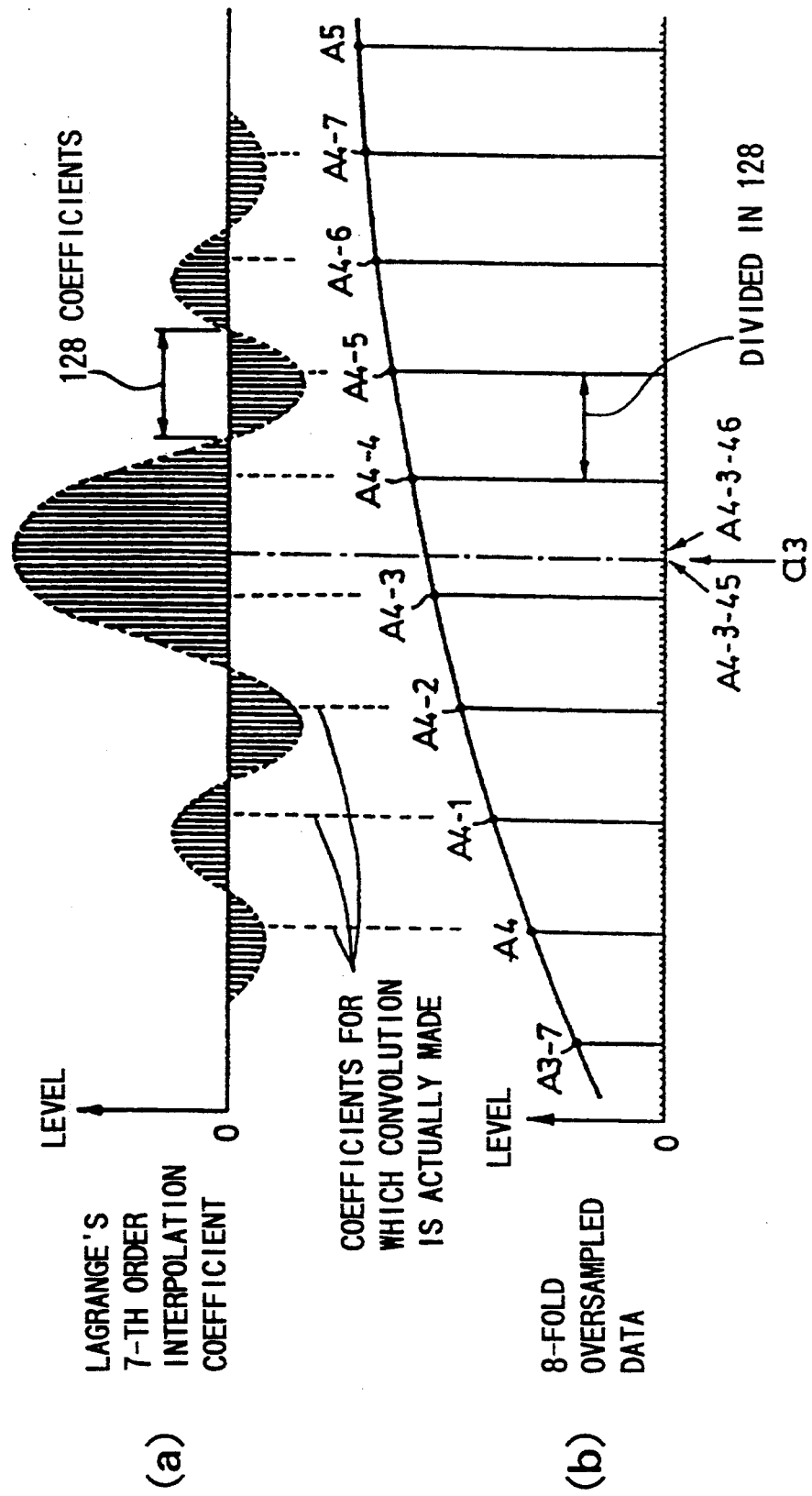
FIG. 10 is a diagram showing an example of a coefficient used for Lagrange's seventh order interpolation stored in a coefficient ROM 86 in FIG. 3B and a convolution operation using this coefficient.

The Lagrange's seventh order interpolation coefficient of the part (a) of FIG. 10 is a coefficient which forms a symmetrical shape and zero-crosses in each interval between eightfold oversampled data. In this example, the interpolation coefficient is constructed of 128 coefficients for each of the 8 intervals totalling $128 \times 8 = 1024$ coefficients.

The computation of Lagrange's interpolation value is made first for the point A4-3-45 and then for the point A4-3-46. First, the point A4-3-45 is aligned with the central position of the coefficient of the part (a) of FIG. 10 and then convolution operation made between the each coefficient and each sample. In this case, 127 samples filling each interval between the eightfold sampled data A4, A4-1, A4-2, ..., A4-7 may be treated as "0" and, therefore, computation need not be made about these samples. After all, the Lagrange's seventh interpolation value at the point A4-3-45 is obtained by performing multiplication between the eight eightfold oversampled samples A4, A4-1, A4-2 ......A4-7 and corresponding coefficients eight times in total and adding results of the multiplications.

After determining the interpolation value at the point A4-3-45, the point A4-3-46 is aligned with the central position of the Lagrange's seventh order interpolation coefficient and Lagrange's seventh order interpolation value at the point A4-3-46 is obtained by performing multiplication between the eight samples A4, A4-1, A4-2, ..., A4-7 and corresponding coefficients eight times in total and adding results of the multiplications.

Figure 11:
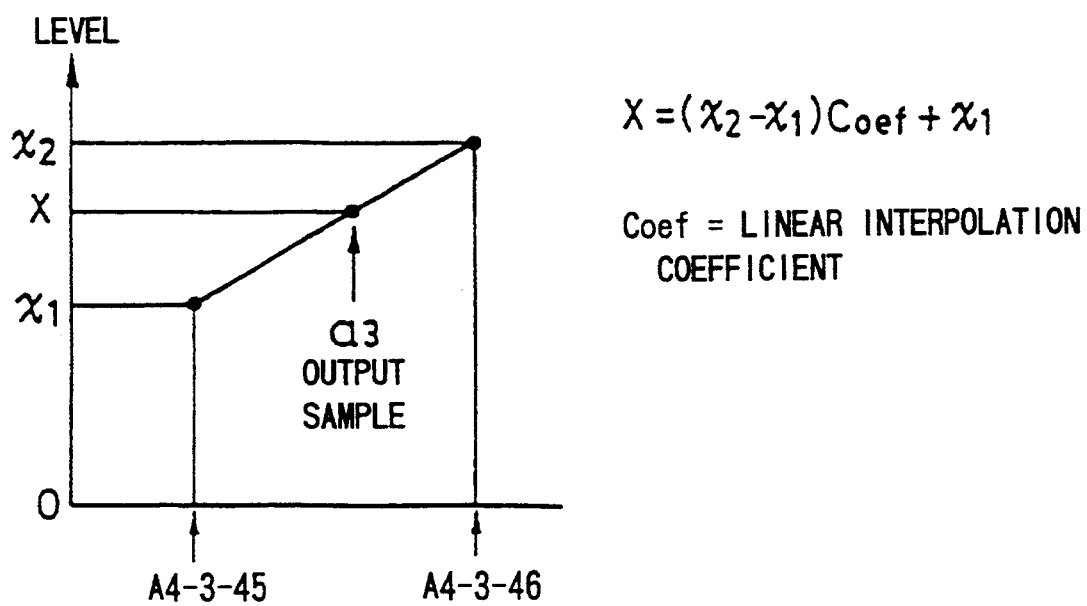
FIG. 11 is a diagram showing a linear interpolation operation in an interpolation coefficient section 34 in FIG. 3B.

Upon determining of the Lagrange's seventh order interpolation values at the two points A4-3-45 and A4-3-46 before and after the object output sample a3, the two values are connected by a straight line as shown in FIG. 11 and a sample value X of the object output sample a3 is obtained by linear interpolation. More specifically, assuming that the sample value at the point A4-3-45 is designated by x1 and the sample value at the point A4-3-46 by x2, the sample value X of the output sample a3 is obtained by $$X = (x2 - x1) Coef + x1$$

(where Coef represents linear interpolation coefficient)

The linear interpolation coefficient here is a value indicating which of positions derived by dividing the interval between the two points by $2^{11}$ the output sample a3 is located at.

Description will now be made about the Lagrange's seventh order interpolaton operation and the linear interpolation operation, The eight samples A4, A4-1, A4-2, ..., A4-7 which are subjected to the convolution operation are read from the asynchronous RAM buffer 22 and latched by a latch circuit 88. The ROM stores Lagrange's seventh order interpolation coefficient shown in the part (a) of FIG. 10 is stored. The interpolation is performed in the following steps:

(i) Computation of Lagrange's seventh order interpolation value immediately before the object output sample The eight samples A4, A4-1, A4-2, ..., A4-7 which are subjected to the convolution operation are successively read from the asynchronous RAM buffer 22 and latched by the latch circuit 88. Eight coefficient values necessary for obtaining the Lagrange's seventh order interpolation value at the point A4-3-45 are successively read from the coefficient ROM 86 by the coefficient ROM read address represented by the 7 middle order bits of the base address and latched by a latch circuit 90. The coefficient ROM read address designates which of coefficients derived by dividing the interval between zero-cross points of the Lagrange's seventh order interpolation coefficient the coefficients which are to be multiplied with the input samples A4, A4-1, A4-2, ..., A4-7 correspond to (the same position in each zero-cross interval as shown in the part (a) of FIG. 10). By one coefficient ROM read address, corresponding eight coefficient values are read out in time sequence (i.e., at each single multiplication and addition) and latched by the latch circuit 80.

First, the sample A4 is read out and latched by the latch circuit 88 whereas one coefficient which is to be multiplied with this sample is read out and latched by the latch circuit 90, and these two data are applied to a multiplier 96 through selectors 92 and 94 and multiplied with each other. The result of multiplication is held by a register 104 through a register 98, a selector 100 and one input terminal of an adder 102. Then, next sample A4-1 is read out and latched by the latch circuit 88 whereas one coefficient to be multiplied with this sample is read out and latched by the latch circuit 90, and these two data are multiplied with each other by the multiplier 96. The result of multiplication is applied to one input terminal of the adder 102 through the selector 100. The preceding result of multiplication held by the register 104 is applied to the other input terminal of the adder 102 through a selector 108. The two data are added together by the adder 102 and the sum of addition is held by the register 104. By repeating this multiplication and addition totalling eight times with respect to the respective samples A4, A4-1, A4-2, ..., A4-7, the Lagrange's seventh order interpolation data at the point A4-3-45 (part (b) of FIG. 10) immediately before the object output sample a3 is obtained and held by the register 106.

(ii) Computation of Lagrange's seventh order interpolation value immediately after the object output sample The eight samples A4, A4-1, A4-2, ..., A4-7 which are subjected to the convolution operation are successively read from the asynchronous RAM buffer 22 and latched by the latch circuit 88. Eight coefficient values necessary for obtaining the Lagrange's seventh order interpolation value at the point A4-3-45 are successively read from the coefficient ROM 86 by an address next to the coefficient ROM read address represented by the 7 middle order bits of the base address and latched by a latch circuit 90.

First, the sample A4 is read out and latched by the latch circuit 88 whereas one coefficient which is to be multiplied with this sample is read out and latched by the latch circuit 90, and these two data are applied to a multiplier 96 through selectors 92 and 94 and multiplied with each other. The result of multiplication is held by a register 104 through a register 98, a selector 100 and one input terminal of an adder 102. Then, next sample A4-1 is read out and latched by the latch circuit 88 whereas one coefficient to be multiplied with this sample is read out and latched by the latch circuit 90, and these two data are multiplied with each other by the multiplier 96. The result of multiplication is applied to one input terminal of the adder 102 through the selector 100. The preceding result of multiplication held by the register 104 is applied to the other input terminal of the adder 102 through a selector 108. The two data are added together by the adder 102 and the sum of addition is held by the register 104. By repeating this multiplication and addition totalling eight times with respect to the respective samples A4, A4-1, A4-2, ..., A4-7, the Lagrange's seventh order interpolation data at the point A4-3-46 (part (b) of FIG. 10) immediately after the object output sample a3 is obtained and held by the register 104.

For reading eight coefficient values necessary for obtaining Lagrange's seventh order interpolation values immediately before and after the output sample from the coefficient ROM 86, the following method for example may be employed. In the ROM 86, the coefficients totalling 1024 are not stored at addresses in their order but are stored in the order of dividing eight sections by 128. That is, the 1024 coefficients are divided into 128 groups on the basis of the same divided position and are arranged in the order of divided positions. Further, in each of the 128 groups, eight coefficients constituting the group are arranged in the order of the eight sections. In this arrangment, the coefficients are stored at the respective addresses of the coefficient ROM 86.

By using a 4-bit counter (called a coefficient read counter) operating at a predetermined high rate clock and adding its count to the least significant bit of the 7 middle order bits of the base address, a sum of this addition is used as a read address for the coefficient ROM 86.

For example, when 7 middle order bit data of the base address is 0000001,

```
   0000001    = 8 (middle order data of base address)
 +     0xxx   = 0 to 7 (coefficient read counter)
   0000001xxx = 8 to 15 (read address)
``` can be used as a read address for the eight coefficients necessary for obtaining the Lagrange's seventh order interpolation value immediately before the object output sample. Likewise,

```
   0000001    = 8 (middle order data of base address)
 +     1xxx   = 8 to 15 (coefficient read counter)
   0000010xxx = 16 to 23 (read address)
``` can be used as a read address for the eight coefficients necessary for obtaining the Lagrange's seventh order interpolation value immediately after the object output sample.

Since the interpolation coefficient shown in the part (a) of FIG. 10 is symmetrical with respect to its central position, a left half OF right half of the interpolation coefficient may be stored in the coefficient ROM 86 for reducing the size of the coefficient ROM 86.

(iii) Linear interpolation

After the Lagrange's seventh order interpolation data x1, x2 at the two points A4-3-45 and A4-3-46 immediately before and after the object output sample a3 have been held by the registers 106 and 104, linear interpolation is performed for obtaining the sample value of the object output sample 3a. This operation is made in the following manner.

First, interpolation data held by the register 106 is applied to one input terminal of the adder 102 through the selector 100. Interpolation data held by the register 104 is likewise applied to the other input terminal of the adder 102 through the selector 108. The adder 102 performs subtraction between the two data to obtain $x2-x1$ and causes the result of subtraction by the register 104.

The difference $x2-x1$ held by the register 104 is applied to the multiplier 96 through the selectors 108 and 109. The linear interpolation coefficient Coef represented by the 11 low order bits of the base address is also applied to the multiplier 96 through the selector 94. The multiplier 96 multiplies the value $x2-x1$ with the linear interpolation coefficient Coef and causes the result of multiplication $(x2-x1)$ Coef by the register 104 through the register 98, selector 100 and adder 102.

The result of operation $(x2-x1)$ Coef held by the register 104 is applied to one input terminal of the adder 102 through the selector 108. The value x1 held by the register 106 is applied to the other input terminal of the adder 102 through the selector 100. The adder 102 adds the two input data together and obtains the object output sample value X in the form of $$X=(x2-x1)Coef+x1$$

The obtained output sample value X is rounded by a rounding circuit 110 and a quantizing noise contained therein is shifted to a high frequency region by a noise shaper 112. The output sample value X thereafter is outputted from the output terminal 40. The above described interpolation operation is performed repeatedly at each output sample period within the cycle of the output sample.

In the above described manner, the sampling frequency converter 12 of FIG. 1 converts the input data having the sampling frequency fs1 to the output data having a sampling frequency fs2 which is asynchronous with the sampling frequency fs1. According to this construction, assuming that the word length of the input sample data is 22 bits, the word length of the Lagrange's seventh order interpolation coefficient is 25 bits and the data length of the sampling frequency ratio Fs is 22 bits, a simulation test result shows that a conversion error in the order of 20 bits can be realized with an improved distortion factor over the prior art converter.

What is claimed is:

1. A sampling frequency converter comprising:
   oversampling means for oversampling an input sample train;
   a memory;
   write control means for writing oversampled data provided from said oversampling means in said memory with a clock synchronized with the oversampled data;
   sampling frequency ratio measuring means for measuring a frequency ratio of a sampling frequency of the input sample train and a sampling frequency of an output sample train to be output;
   read control means for reading from said memory the oversampled data used for obtaining interpolation data at two points before and after an output sample value which realizes the measured sampling frequency ratio by a polynomial interpolation;

polynomial interpolation means for obtaining the interpolation data at the two points by the polynomial interpolation on the basis of the oversampled data read from said memory by said read control means; and linear interpolation means for linear-interpolating between the polynomial interpolation data at the two points obtained by the polynomial interpolation and thereby obtaining the output sample value realizing the sampling frequency ratio.

2. A sampling frequency converter as defined in claim 1 where in said sampling frequency ratio measuring means comprises a counter counting with a clock synchronized with the input sample train and providing a count of said counter for plural word periods of the output sample train as said sampling frequency ratio;

said read control means uses, as read address data for reading said memory, high order data among three data obtained by dividing bits which are an accumulated value of counts of said counter accumulated for each output sample period;

said polynomial interpolation means uses, as address data for reading a second memory storing an interpolation coefficient for effecting the polynomial interpolation, middle order data among the three data obtained by dividing the bits which are the accumulated value of the counts of said counter; and said linear interpolation means uses, as coefficient data for the linear interpolation, low order data among the three data obtained by dividing the bits which are the accumulated value of the counts of said counter.

3. A sampling frequency converter comprising:

a memory;

sampling frequency ratio measuring means for measuring a frequency ratio of a sampling frequency of an input sample train and a sampling frequency of an output sample train to be output;

read control means for reading from said memory an input sample necessary for obtaining an output sample value which realizes the measured sampling frequency ratio by interpolation on the basis of the sampling frequency ratio; and interpolation means for obtaining the output sample data by interpolation on the basis of the input sample data read from said memory by said read control means;

said sampling frequency ratio measuring means comprising:

a counter counting a clock synchronized with the input sample; and count output means for measuring a count of said counter for plural word periods of the output sample and outputting this count as a measured value of the sampling frequency ratio.

4. A sampling frequency converter as defined in claim 3 wherein said sampling frequency ratio measuring means comprises:

sampling frequency ratio variation detection means for detecting variation in the measured sampling frequency ratio; and sampling frequency ratio measuring period control means for prolonging the plural word periods of the output sample during which the sampling frequency ratio is measured when variation in the sampling frequency ratio is small and shortening the plural word periods of the output sample when variation in the sampling frequency ratio is large.

5. A sampling frequency converter as defined in claim 3 wherein said read control means comprises:

address difference detection means for detecting difference between a write address and a read address for said memory; and read address correction means for correcting, upon detection of approaching of the read address within a predetermined range toward the write address on the basis of the detected address difference, the read address in a direction in which the read address is withdrawn from the write address.

* * * * *